(12) United States Patent
Chi et al.

(10) Patent No.: US 8,552,795 B2
(45) Date of Patent: Oct. 8, 2013

(54) SUBSTRATE BIAS CONTROL CIRCUIT FOR SYSTEM ON CHIP

(75) Inventors: Shyh-An Chi, Hsinchu (TW); Shiue Tsong Shen, Tuku Township (TW); Jyy Anne Lee, Taipei (TW); Yun-Han Lee, Baoshan Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 629 days.

(21) Appl. No.: 12/793,884

(22) Filed: Jun. 4, 2010

(65) Prior Publication Data

US 2011/0095811 A1  Apr. 28, 2011

Related U.S. Application Data

(60) Provisional application No. 61/254,055, filed on Oct. 22, 2009.

(51) Int. Cl.
*G05F 3/08* (2006.01)
*H03K 17/14* (2006.01)

(52) U.S. Cl.
USPC .................. 327/543; 327/513; 323/907

(58) Field of Classification Search
None
See application file for complete search history.

(56) References Cited

U.S. PATENT DOCUMENTS

| | | | |
|---|---|---|---|
| 5,638,418 A * | 6/1997 | Douglass et al. | 377/25 |
| 6,695,475 B2 * | 2/2004 | Yin | 374/171 |
| 6,831,500 B2 * | 12/2004 | Sato et al. | 327/536 |
| 7,250,807 B1 | 7/2007 | Doyle | |
| 7,463,096 B2 | 12/2008 | Chi et al. | |
| 7,696,811 B2 * | 4/2010 | Barrows et al. | 327/534 |

OTHER PUBLICATIONS

Chinese Application No. 2012062500995540 which corresponds to U.S. Appl. No. 12/793,884, Jun. 8, 2012.
Tschanz, James W., et al., "Adaptive Body Bias Reducing Impacts of Die-to-Die and Within-Die Parameter Variations on Microprocessor Frequency and Leakage", IEEE Journal of Solid-State Circuits, vol. 37, No. 11, Nov. 2002.

* cited by examiner

*Primary Examiner* — Lincoln Donovan
*Assistant Examiner* — Terry L Englund
(74) *Attorney, Agent, or Firm* — Lowe Hauptman & Ham, LLP

(57) ABSTRACT

A substrate bias control circuit includes a process voltage temperature (PVT) effect transducer that responds to a PVT effect. A PVT effect quantifier is coupled to the PVT effect transducer. The PVT effect quantifier quantifies the PVT effect to provide an output. The PVT effect quantifier includes at least one counter and a period generator. The period generator provides a time period for the counter. A bias controller that is coupled to PVT effect quantifier is configured to receive the output of the PVT effect quantifier. The bias controller is configured to provide a bias voltage. The bias controller includes a bias voltage comparator.

20 Claims, 5 Drawing Sheets

| | | |
|---|---|---|
| Entry A | TYP corner Ring OSC count | Voltage A ($V_{PP}/V_{BB}$) |
| Entry B | FF corner Ring OSC count | Voltage B ($V_{PP}/V_{BB}$) |

Fig. 4

SUBSTRATE BIAS CONTROL CIRCUIT FOR SYSTEM ON CHIP

CROSS-REFERENCE TO RELATED APPLICATIONS

The present application claims priority of U.S. Provisional Patent Application Ser. No. 61/254,055, filed on Oct. 22, 2009, which is incorporated herein by reference in its entirety.

TECHNICAL FIELD

The present disclosure relates generally to an integrated circuit, more particularly a substrate bias control circuit.

BACKGROUND

A conventional substrate bias control circuit uses a phase detector circuit to measure process voltage temperature (PVT) effect. However, because this circuit is generally a combination of digital and analog circuits, it is not easy to be integrated in a system on chip (SOC) design. Also, it is not easy to migrate to other technology node as the integrated circuit scale shrinks. Accordingly, new substrate bias control circuits are desired.

BRIEF DESCRIPTION OF THE DRAWINGS

For a more complete understanding of the present disclosure, and the advantages of disclosed embodiments, reference is now made to the following descriptions taken in conjunction with the accompanying drawings, in which:

FIG. 4 illustrates an exemplary bias voltage lookup table associated with the exemplary embodiment of the substrate bias control circuit in FIG. 3;

DETAILED DESCRIPTION

The making and using of exemplary embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

An exemplary circuit that is described in the disclosure is configured to provide an appropriate substrate bias (based on PVT variation) to adjust chip performance and power consumption. The circuit can be easily integrated in an SOC design. If the substrate of a metal-oxide-semiconductor field-effect transistor (MOSFET) device is backward biased, power consumption of the devices can be saved. If the substrate of a MOSFET device is forward biased, speed of the devices can be boosted.

Figure 1:
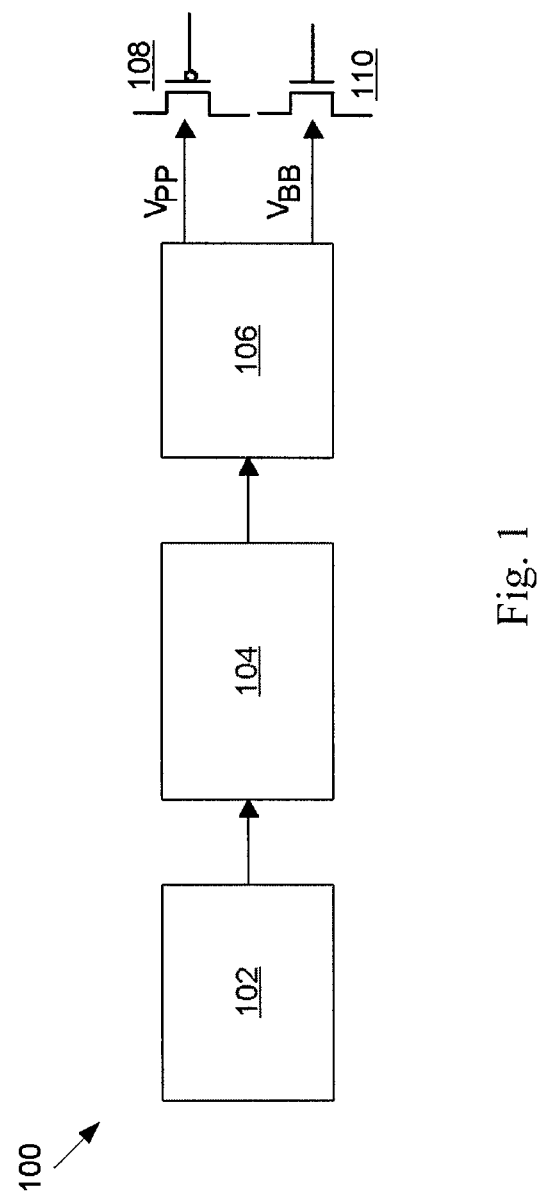
FIG. 1 illustrates a schematic drawing of an exemplary substrate bias control circuit.

FIG. 1 illustrates a schematic drawing of an exemplary substrate bias control circuit. The substrate bias control circuit 100 includes a PVT effect transducer 102, a PVT effect quantifier 104, and a bias controller 106. The PVT effect transducer 102 responds to the PVT environment change and shows a corresponding physical characteristic change that can be measured, e.g. a frequency change of a ring oscillator. The PVT effect transducer 102 is coupled to the PVT effect quantifier 104.

The PVT effect quantifier 104 quantifies the physical characteristic change that is detected from the PVT effect transducer 102. For example, pulses from a ring oscillator can be counted during a specified time to show its frequency change due to PVT variations. The PVT effect quantifier 104 is coupled to the bias controller 106.

The bias controller 106 receives the quantified output from the PVT effect quantifier 104 and controls the substrate bias voltages $V_{PP}$ and $V_{BB}$ for a p-channel MOSFET (PMOS) transistor 108 and an n-channel MOSFET (NMOS) transistor 110, respectively. The bias controller 106 can have a programmable or configurable input for threshold values or lookup table for its decision-making.

Figure 2:
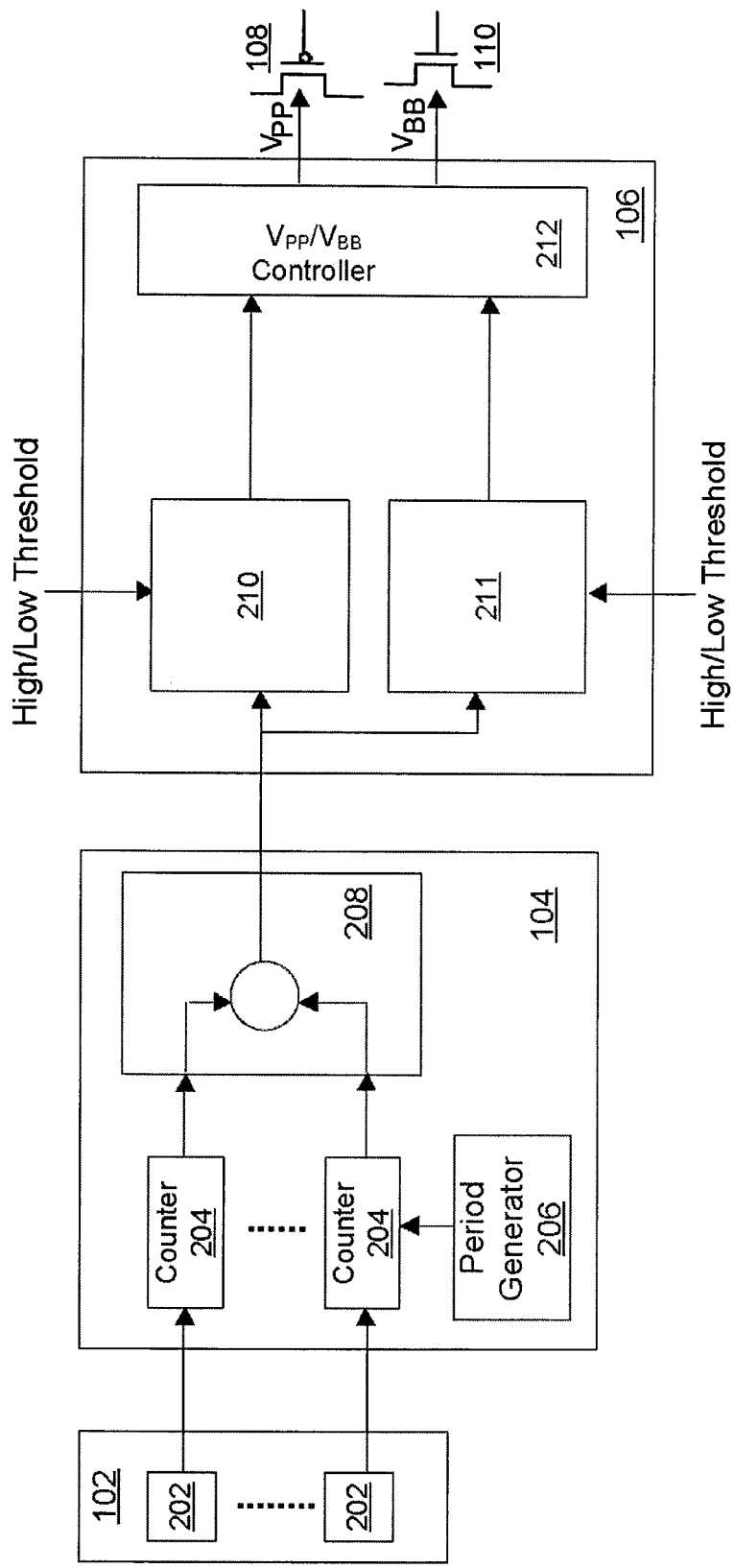
FIG. 2 illustrates an exemplary embodiment of the substrate bias control circuit.

FIG. 2 illustrates an exemplary embodiment of the substrate bias control circuit. In FIG. 2, the PVT effect transducer 102 includes ring oscillators 202. The ring oscillators 202 generate pulses at certain frequencies and include an odd number of inverters. Each inverter contributes to the delay of the signal passing the ring of inverters. Changing the power supply voltage changes the delay through each inverter, and thus changes the oscillator frequency. For example, higher voltages typically decreasing the delay and increasing the oscillator frequency. The frequencies of the ring oscillators 202 reflect the PVT environment variations.

In some embodiments, the PVT effect quantifier 104 includes at least one counter, e.g. counters 204, and a period generator 206. The period generator 206 provides a time period for the counters 204. The counters 204 are connected to ring oscillators 202. The counters 204 provide counter values of each ring oscillator 202 during the time period generated by the period generator 206.

The PVT effect quantifier 104 can further include a counter comparator 208, and the counter comparator 208 compares counter values from each counter 204 and selects one counter value as the output of the PVT effect quantifier 104. The selection of one counter value can be according to any desired criteria, e.g. a median (typical) value, the highest (fastest) value, the lowest (slowest) value, etc.

In some embodiments, the counter comparator 208 is optional. For example, if only one ring oscillator 202 and one counter 204 are used, then the counter comparator 208 can be saved and the counter value is sent to the bias controller 106 as the output of the PVT effect quantifier 104.

The bias controller 106 includes bias voltage comparators 210 and 211. The bias controller 106 can use the output of the PVT effect quantifier 104 to determine the bias voltages $V_{PP}$ and $V_{BB}$. When the count value is higher than a high threshold value, then a backward bias for the substrate of a MOSFET device can be used to save power. When the count value is lower than the low threshold value, a forward bias can be used to boost performance. Device characterization data can be used to determine the high/low threshold values. For example, the device characterization data can relate to the count value and corresponding high/low threshold values. The bias voltage comparators 210 and 211 can be merged into one bias voltage comparator.

More particularly, the bias voltage comparator 210 compares the output received from the PVT effect quantifier 104 to a high threshold value. If the output is higher than the high threshold value, the $V_{PP}/V_{BB}$ controller 212 in the bias controller 106 increases the bias voltage $V_{PP}$ for PMOS transistor 108. The bias voltage $V_{PP}$ is connected to the substrate of the PMOS transistor 108. The increase or decrease step value can be programmed. For example, a 50 mV step can be used in one embodiment.

The bias voltage comparator 210 compares the output received from the PVT effect quantifier 104 to a low threshold value. If the output is lower than the low threshold value, the $V_{PP}/V_{BB}$ controller 212 in the bias controller 106 decreases the bias voltage $V_{PP}$ for PMOS transistor 108.

The bias voltage comparator 211 compares the output received from the PVT effect quantifier 104 to a high threshold value. If the output is higher than the high threshold value, the $V_{PP}/V_{BB}$ controller 212 in the bias controller 106 decreases the bias voltage $V_{BB}$ for NMOS transistor 110. The bias voltage $V_{BB}$ is connected to the substrate of an NMOS transistor 110.

The bias voltage comparator 211 compares the output received from the PVT effect quantifier 104 to a low threshold value. If the output is lower than the low threshold value, the $V_{PP}/V_{BB}$ controller 212 in the bias controller 106 increases the bias voltage $V_{BB}$ for NMOS transistor 110.

The embodiment in FIG. 2 can be referred to as a closed-loop adaptive substrate bias control circuit in the sense that the bias voltages are continuously adjusted and updated based on the comparison with programmable or configurable threshold values.

Figure 3:
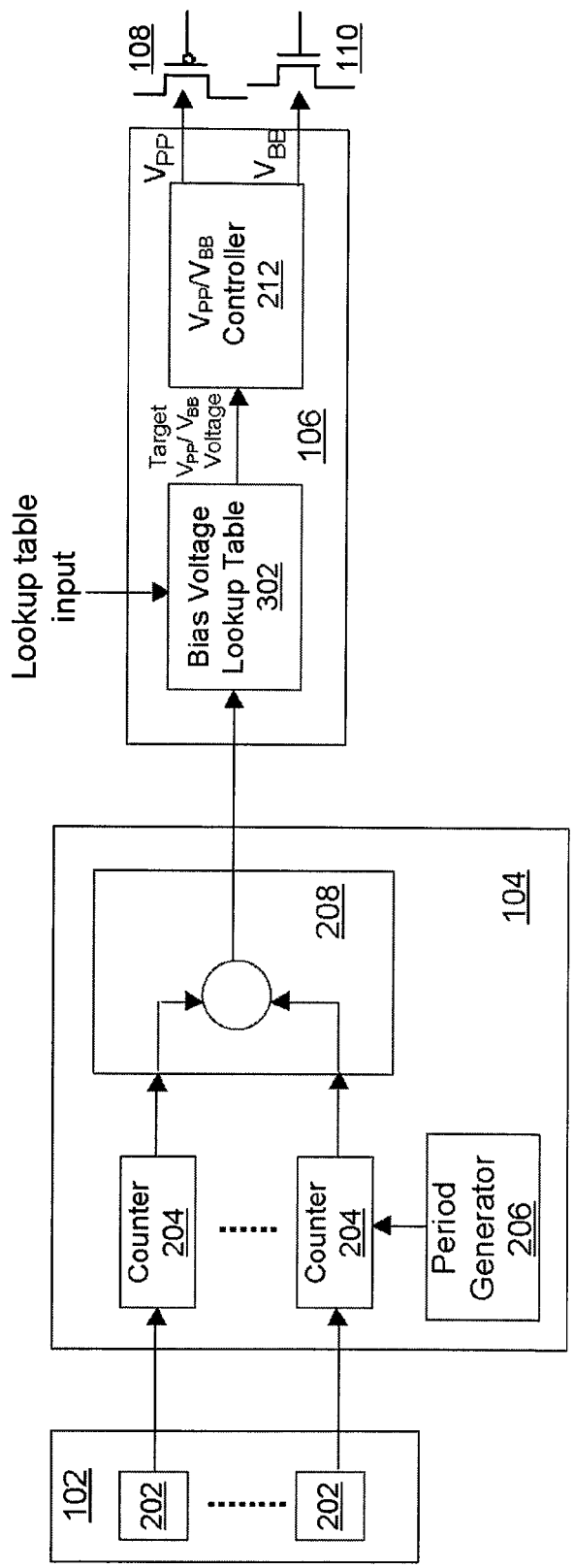
FIG. 3 illustrates another exemplary embodiment of the substrate bias control circuit.

FIG. 3 illustrates another exemplary embodiment of the substrate bias control circuit. The PVT effect transducer 102 and the PVT effect quantifier 104 have similar components as the embodiment shown in FIG. 2. However, the bias controller 106 has a programmable or configurable bias voltage lookup table 302 instead of the bias voltage comparators 210 and 211. The bias voltage lookup table 302 can be updated through an outside input.

In one embodiment, the bias voltage lookup table 302 can include reference values for the output of the PVT effect quantifier 104 and $V_{PP}/V_{BB}$ target values that correspond to the reference values. In the bias controller 106, the output from the PVT effect quantifier 104 can be compared to the reference values in the bias voltage lookup table 302, and corresponding $V_{PP}/V_{BB}$ target values can be used to control the substrate bias voltages for PMOS transistor 108 and NMOS transistor 110.

The embodiment in FIG. 3 can be referred to as an open-loop adaptive substrate bias control circuit in the sense that the bias voltages can be adjusted at once to the target values, based on the reference values in the bias voltage lookup table 302.

FIG. 4 illustrates an exemplary bias voltage lookup table associated with the exemplary embodiment of the substrate bias control circuit in FIG. 3. Entry A in the first row includes a typical corner ring oscillator count value as the reference value and Voltage A as the $V_{PP}/V_{BB}$ target value. Field of Voltage A contains two target values for $V_{PP}$ and $V_{BB}$, respectively. The typical corner refers to a portion of integrated circuits on a semiconductor wafer that shows typical NMOS/PMOS transistor performances. Entry B in the second row includes a fast-fast (FF) corner ring oscillator count value as the reference value and Voltage B as the $V_{PP}/V_{BB}$ target value. Field of Voltage B contains two target values for $V_{PP}$ and $V_{BB}$, respectively. The FF corner refers to a portion of integrated circuits on a semiconductor wafer that shows relatively fast NMOS/PMOS transistor performances.

If the count value from PVT effect quantifier 104 is higher than the entry A's ring oscillator count value, but lower than entry B's ring oscillator count value, then the bias controller 106 can use Voltage A as the target voltage. If the count value from PVT effect quantifier 104 is higher than entry B's ring oscillator count value, the bias controller 106 can use Voltage B as the target voltage. In this simple example, the count value is assumed to be higher than the entry A's ring oscillator count value. Even though one embodiment of the bias voltage lookup table is described above for illustration, the bias voltage lookup table may include different formats and different values, and the bias controller 106 can use different algorithms in embodiments.

Figure 5B:
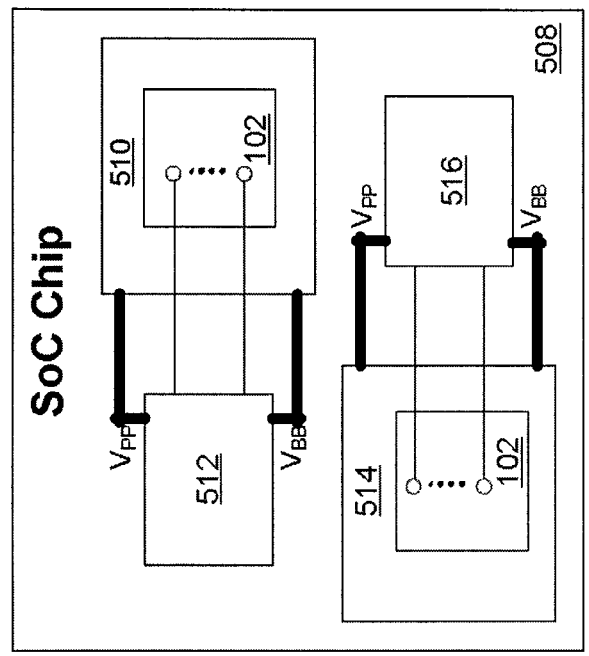
FIG. 5B illustrates a schematic drawing of another exemplary implementation of the substrate bias control circuit on a SOC chip.
Figure 5A:
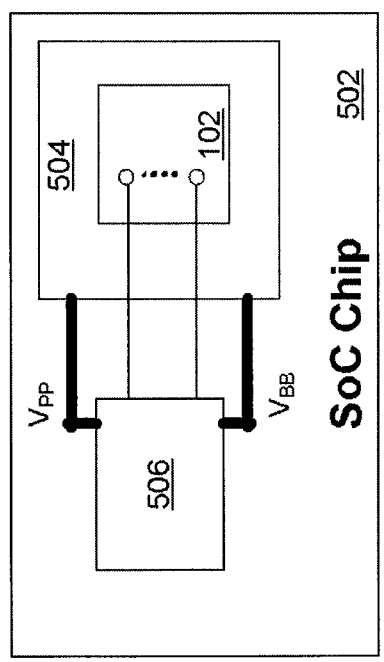
FIG. 5A illustrates a schematic drawing of an exemplary implementation of the substrate bias control circuit on a SOC chip.

FIG. 5A illustrates a schematic drawing of an exemplary implementation of the substrate bias control circuit on a SOC chip. The SOC chip 502 includes a power domain 504 and closed/open-loop bias control circuit 506. The power domain 504 includes the PVT effect transducer 102 and other integrated circuits, e.g. memories, logics, NMOS transistors, PMOS transistors, etc. The PVT effect transducer 102 is located on the SOC chip 502 where the PVT effects need to be monitored, because PVT effects can affect the integrated circuit performance. The closed/open-loop bias control circuit 506 includes the PVT effect quantifier 104 and the bias controller 106 in FIG. 1. The bias controller 106 can be either a closed-loop adaptive substrate bias control circuit as shown in FIG. 2, or an open-loop adaptive substrate bias control circuit as shown in FIG. 3. The functions of the PVT effect transducer 102, PVT effect quantifier 104, and bias controller 106 are the same as described above.

FIG. 5B illustrates a schematic drawing of another exemplary implementation of the substrate bias control circuit on a SOC chip. The SOC chip 508 includes two separate power domains 510 and 514 and two separate closed/open-loop bias control circuits 512 and 516. Each closed/open-loop bias control circuit 512 or 516 includes the PVT effect quantifier 104 and the bias controller 106. Each of the two power domains 510 or 514 includes a separate PVT effect transducer 102, because different location on the SOC chip 508 can be subject to different PVT effects. Based on the local PVT effects monitored by the PVT effect transducer 102, separate closed/open-loop bias control circuits 512 and 516 can adjust the bias voltages separately. The functions of the PVT effect transducer 102, PVT effect quantifier 104, and bias controller 106 are the same as described above.

The substrate bias voltage control circuit described above can be implemented solely by logic circuit process, and thus it can be easily integrated in an SOC design. Also programmable or configurable input for threshold values and bias voltage lookup tables allows easy fine-tuning. The methodology described in the present disclosure can be migrated to any technology node easily. A person skilled in the art will appreciate that there can be many embodiment variations for disclosed embodiments.

Although exemplary embodiments of the present invention and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure herein, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A substrate bias control circuit, comprising:
a process voltage temperature (PVT) effect transducer for responding to a PVT effect;
a PVT effect quantifier coupled to the PVT effect transducer for quantifying the PVT effect to provide an output, the PVT effect quantifier including
at least one counter, and
a period generator for providing a time period for the at least one counter; and
a bias controller configured to receive the output of the PVT effect quantifier and provide a bias voltage for a substrate of a p-channel metal-oxide semiconductor (PMOS) transistor,
wherein the bias controller is further configured to compare the output received from the PVT effect quantifier to a first threshold value, and increase the bias voltage if the output is higher than the first threshold value.

2. The circuit of claim 1, wherein the PVT effect transducer comprises a first ring oscillator connected to a first counter of the at least one counter that provides a first counter value of the first ring oscillator during the time period.

3. The circuit of claim 2, wherein
the PVT effect transducer further comprises a second ring oscillator connected to a second counter of the at least one counter that provides a second counter value of the second ring oscillator during the time period, and
the PVT effect quantifier further comprises a counter comparator for comparing the first counter value and the second counter value and for selecting the first counter value or the second counter value as the output of the PVT effect quantifier.

4. The circuit of claim 1, wherein the bias controller is further configured to compare the output received from the PVT effect quantifier to a second threshold value that is lower than the first threshold value, and decrease the bias voltage if the output is lower than the second threshold value.

5. A substrate bias control circuit, comprising:
a process voltage temperature (PVT) effect transducer for responding to a PVT effect;
a PVT effect quantifier coupled to the PVT effect transducer for quantifying the PVT effect to provide an output, the PVT effect quantifier including
at least one counter, and
a period generator for providing a time period for the at least one counter; and
a bias controller configured to receive the output of the PVT effect quantifier and provide a bias voltage for a substrate of an n-channel metal-oxide semiconductor (NMOS) transistor,
wherein the bias controller configured to compare the output received from the PVT effect quantifier to a first threshold value, and decrease the bias voltage if the output is higher than the first threshold value.

6. The circuit of claim 5, wherein the bias controller is further configured to compare the output received from the PVT effect quantifier to a second threshold value that is lower than the first threshold value, and increase the bias voltage if the output is lower than the second threshold value.

7. The circuit of claim 5, wherein the PVT effect transducer comprises a first ring oscillator connected to a first counter of the at least one counter that provides a first counter value of the first ring oscillator during the time period.

8. The circuit of claim 7, wherein
the PVT effect transducer further comprises a second ring oscillator connected to a second counter of the at least one counter that provides a second counter value of the second ring oscillator during the time period, and
the PVT effect quantifier further comprises a counter comparator for comparing the first counter value and the second counter value and for selecting the first counter value or the second counter value as the output of the PVT effect quantifier.

9. An integrated circuit, comprising:
a PMOS transistor;
an NMOS transistor;
a substrate bias control circuit for providing a first bias voltage for the PMOS transistor and a second bias voltage for the NMOS transistor, the substrate bias control circuit comprising:
a process voltage temperature (PVT) effect transducer for responding to a PVT effect;
a PVT effect quantifier coupled to the PVT effect transducer for quantifying the PVT effect to provide an output, the PVT effect quantifier including
at least one counter, and
a period generator for providing a time period for the at least one counter; and
a bias controller configured to receive the output of the PVT effect quantifier and provide the first bias voltage and the second bias voltage, the bias controller including a first bias voltage comparator and a second bias voltage comparator,
wherein the PVT effect transducer comprises
a first ring oscillator connected to a first counter of the at least one counter that provides a first counter value of the first ring oscillator during the time period, and
a second ring oscillator connected to a second counter of the at least one counter that provides a second counter value of the second ring oscillator during the time period, and
wherein the PVT effect quantifier further comprises a counter comparator for comparing the first counter value and the second counter value and for selecting the first counter value or the second counter value as the output of the PVT effect quantifier.

10. The integrated circuit of claim 9, wherein
the first bias voltage comparator is configured to compare the output received from the PVT effect quantifier to a first threshold value, and
the bias controller is further configured to increase the first bias voltage if the output is higher than the first threshold value.

11. The integrated circuit of claim 10, wherein
the first bias voltage comparator is further configured to compare the output received from the PVT effect quantifier to a second threshold value that is lower than the first threshold value, and
the bias controller is further configured to decrease the first bias voltage if the output is lower than the second threshold value.

12. The integrated circuit of claim 9, wherein
the second bias voltage comparator is configured to compare the output received from the PVT effect quantifier to a first threshold value, and
the bias controller is further configured to decrease the second bias voltage if the output is higher than the first threshold value.

13. The integrated circuit of claim 12, wherein
the second bias voltage comparator is further configured to compare the output received from the PVT effect quantifier to a second threshold value that is lower than the first threshold value, and
the bias controller is further configured to increase the second bias voltage if the output is lower than the second threshold value.

14. An integrated circuit, comprising:
a PMOS transistor;
an NMOS transistor;
a substrate bias control circuit for providing a first bias voltage for the PMOS transistor and a second bias voltage for the NMOS transistor, the substrate bias control circuit including:
  a process voltage temperature (PVT) effect transducer for responding to a PVT effect, wherein the PVT effect transducer comprises a first ring oscillator;
  a PVT effect quantifier coupled to the PVT effect transducer for quantifying the PVT effect to provide an output, the PVT effect quantifier including
    at least one counter,
    a period generator for providing a time period for the at least one counter, and
    a comparator, wherein the first ring oscillator is connected to a first counter of the at least one counter that provides a first counter value of the first ring oscillator during the time period; and
  a bias controller configured to receive the output from the PVT effect quantifier and provide the first bias voltage and the second bias voltage, the bias controller including a first bias voltage comparator and a second bias voltage comparator, wherein the first bias voltage comparator is configured to compare the output received from the PVT effect quantifier to a first threshold value and a second threshold value to provide the first bias voltage, and the second bias voltage comparator is configured to compare the output received from the PVT effect quantifier to the first threshold value and the second threshold value to provide the second bias voltage.

15. The integrated circuit of claim 14, wherein the PVT effect transducer further includes a second ring oscillator connected to a second counter of the at least one counter that provides a second counter value of the second ring oscillator during the time period, and the PVT effect quantifier further includes a counter comparator, wherein the counter comparator is configured to compare the first counter value and the second counter value and select the first counter value or the second counter value as the output of the PVT effect quantifier.

16. A substrate bias control circuit, comprising:
a process voltage temperature (PVT) effect transducer for responding to a PVT effect;
a PVT effect quantifier coupled to the PVT effect transducer for quantifying the PVT effect to provide an output, the PVT effect quantifier including
  at least one counter, and
  a period generator for providing a time period for the at least one counter; and
a bias controller configured to receive the output of the PVT effect quantifier and provide a first bias voltage for a substrate of a p-channel metal-oxide semiconductor (PMOS) transistor and a second bias voltage for a substrate of an n-channel metal-oxide semiconductor (NMOS) transistor,
wherein the bias controller comprises a bias voltage lookup table that includes
  a first reference value for the output of the PVT effect quantifier,
  a first target value for the first bias voltage that corresponds to the first reference value, and
  a second target value for the second bias voltage that corresponds to the first reference value.

17. The circuit of claim 16, wherein
the bias voltage lookup table further includes
  a second reference value for the output of the PVT effect quantifier,
  a third target value for the first bias voltage that corresponds to the second reference value, and
  a fourth target value for the second bias voltage that corresponds to the second reference value,
the first reference value corresponds to a first portion of an integrated circuit,
the second reference value corresponds to a second portion of the integrated circuit, and
NMOS and PMOS transistor performances in the first portion of the integrated circuit are slower than in the second portion of the integrated circuit.

18. The circuit of claim 17, wherein the second reference value is greater than the first reference value.

19. The circuit of claim 16, wherein the PVT effect transducer comprises a first ring oscillator connected to a first counter of the at least one counter that provides a first counter value of the first ring oscillator during the time period.

20. The circuit of claim 19, wherein
the PVT effect transducer further comprises a second ring oscillator connected to a second counter of the at least one counter that provides a second counter value of the second ring oscillator during the time period, and
the PVT effect quantifier further comprises a counter comparator for comparing the first counter value and the second counter value and for selecting the first counter value or the second counter value as the output of the PVT effect quantifier.

* * * * *